United States Patent
Asada et al.

(10) Patent No.: US 11,195,807 B2
(45) Date of Patent: Dec. 7, 2021

(54) SEMICONDUCTOR DEVCE, HIGH-FREQUENCY POWER AMPLIFIER, AND METHOD OF MANUFACTURING SEMICONDUCTOR DEVICE

(71) Applicant: Mitsubishi Electric Corporation, Tokyo (JP)

(72) Inventors: Tomoyuki Asada, Tokyo (JP); Yoichi Nogami, Tokyo (JP); Kenichi Horiguchi, Tokyo (JP); Shigeo Yamabe, Tokyo (JP); Satoshi Miho, Tokyo (JP); Kenji Mukai, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/629,669

(22) PCT Filed: Sep. 28, 2017

(86) PCT No.: PCT/JP2017/035233
§ 371 (c)(1),
(2) Date: Jan. 9, 2020

(87) PCT Pub. No.: WO2019/064431
PCT Pub. Date: Apr. 4, 2019

(65) Prior Publication Data
US 2020/0227363 A1    Jul. 16, 2020

(51) Int. Cl.
*H01L 23/66*      (2006.01)
*H01L 21/48*      (2006.01)
(Continued)

(52) U.S. Cl.
CPC .......... *H01L 23/66* (2013.01); *H01L 21/4882* (2013.01); *H01L 21/565* (2013.01);
(Continued)

(58) Field of Classification Search
None
See application file for complete search history.

(56) References Cited

U.S. PATENT DOCUMENTS 5,216,283 A * 6/1993 Lin .................. H01L 23/10
257/708
5,566,052 A * 10/1996 Hughes ............ H01L 23/367
174/354
(Continued)

FOREIGN PATENT DOCUMENTS

JP    2004-200264 A    7/2004
JP    2005328015 A    11/2005
(Continued)

OTHER PUBLICATIONS

International Search Report issued in PCT/JP2017/035233; dated Nov. 14, 2017.
(Continued)

*Primary Examiner* — Evren Seven
(74) *Attorney, Agent, or Firm* — Studebaker & Brackett PC (57) ABSTRACT

Reduction in impedance in a lead connected to a semiconductor element is achieved while achieving anchor effect. The semiconductor device includes a heatsink, a semiconductor element, a lead disposed on an upper side of the heatsink, and a molding material formed to cover the lead, the heatsink, and the semiconductor element. Formed on an edge portion of a lower surface in a position, in the heatsink, overlapping with the lead in a plan view is a first convex portion protruding more than an edge portion of an upper surface in the position, and formed on an edge portion of an upper surface in a position, in the heatsink, which does not overlap with the lead in a plan view is a second convex portion protruding more than an edge portion of a lower surface in the position.

9 Claims, 10 Drawing Sheets

(51) Int. Cl.
*H01L 21/56* (2006.01)
*H01L 23/31* (2006.01)
*H01L 23/367* (2006.01)
*H01L 23/00* (2006.01)
*H03F 1/30* (2006.01)
*H03F 3/19* (2006.01)

(52) U.S. Cl.
CPC ...... *H01L 23/3114* (2013.01); *H01L 23/3672* (2013.01); *H01L 24/48* (2013.01); H01L 24/32 (2013.01); H01L 24/73 (2013.01); H01L 2223/6611 (2013.01); H01L 2223/6655 (2013.01); H01L 2224/32245 (2013.01); H01L 2224/48091 (2013.01); H01L 2224/48137 (2013.01); H01L 2224/48175 (2013.01); H01L 2224/73265 (2013.01); H01L 2924/30107 (2013.01); H01L 2924/30111 (2013.01); H03F 1/30 (2013.01); H03F 3/19 (2013.01)

(56) References Cited

U.S. PATENT DOCUMENTS

| | | |
|---|---|---|
| 2004/0113248 A1 | 6/2004 | Ito et al. |
| 2005/0231925 A1 | 10/2005 | Fukuda et al. |
| 2012/0171814 A1* | 7/2012 | Choi .................. H01L 23/3128 438/107 |
| 2014/0077345 A1 | 3/2014 | Uno et al. |
| 2014/0191809 A1 | 7/2014 | Kamiyama et al. |
| 2016/0005680 A1* | 1/2016 | Israel ................ H01L 23/49568 257/675 |
| 2016/0064312 A1 | 3/2016 | Bando |

FOREIGN PATENT DOCUMENTS

| | | |
|---|---|---|
| JP | 2006310425 A | 11/2006 |
| JP | 2015053346 A | 3/2015 |
| JP | 2016046467 A | 4/2016 |
| WO | 2013094101 A1 | 6/2013 |
| WO | 2013175690 A1 | 11/2013 |

OTHER PUBLICATIONS

An Office Action mailed by the Korean Intellectual Property Office dated Jul. 21, 2021, which corresponds to Korean Patent Application No. 10-2020-7007874 and is related to U.S. Appl. No. 16/629,669; with English language translation.

* cited by examiner

SEMICONDUCTOR DEVICE, HIGH-FREQUENCY POWER AMPLIFIER, AND METHOD OF MANUFACTURING SEMICONDUCTOR DEVICE

TECHNICAL FIELD

The technique disclosed in the specification of the present application relates to a semiconductor device, a high-frequency power amplifier including the semiconductor device, and a method of manufacturing the semiconductor device.

BACKGROUND ART

In a conventional package structure that a semiconductor element disposed on an upper surface of a heatsink is covered by a molding material, used for purpose of anchoring the molding material to the heatsink, that is to say, producing anchor effect is a heatsink with a shape having a convex portion on an edge portion of the upper surface covered by the molding material so that the convex portion protrudes more than an edge portion of a lower surface exposed from the molding material (refer to Patent Document 1, for example).

PRIOR ART DOCUMENTS

Patent Documents

Patent Document 1: International Publication No. 2013/094101

SUMMARY

Problem to be Solved by the Invention

However, in the case where the heatsink having the shape described above is used, a parasitic inductance component on a heatsink side becomes redundant in a region where a lead connected to the semiconductor element via a wire and the heatsink overlap with each other in an up-down direction when the heatsink is grounded. Thus, there is a problem that impedance in the lead cannot be reduced to a desired level. In this case, the impedance in the lead is high, so that a high performance is obstructed in a case where a semiconductor device is used as a high-frequency amplifier, for example.

The technique disclosed in the specification of the present application is therefore has been made to solve the above problems, and it is an object of the technique to provide a technique capable of reducing impedance in a lead connected to a semiconductor element while producing an effect of anchoring a molding material.

Means to Solve the Problem

A first embodiment of a technique disclosed in the specification of the present application includes: a heatsink at least whose lower surface is grounded; semiconductor element which is disposed on an upper surface of the heatsink and a high-frequency signal is input to or output from; at least one lead electrically connected to the semiconductor element via a wire and disposed on an upper side of the heatsink; and a molding material formed to cover part of the lead, at least an upper surface of the heatsink, and the semiconductor element, wherein the heatsink is disposed to partially overlap with the lead in a plan view, on an edge portion of a lower surface in a position, in the heatsink, overlapping with the lead in a plan view, at least one first convex portion protruding more than an edge portion of an upper surface in the position is formed, and on an edge portion of an upper surface in a position, in the heatsink, which does not overlap with the lead in a plan view, at least one second convex portion protruding more than an edge portion of a lower surface in the position is formed.

A second embodiment of a technique disclosed in the specification of the present application includes: a heatsink at least whose lower surface is grounded; a semiconductor element which is disposed on an upper surface of the heatsink and a high-frequency signal is input to or output from; at least one lead electrically connected to the semiconductor element via a wire and disposed on an upper side of the heatsink; and a molding material formed to cover part of the lead, at least an upper surface of the heatsink, and the semiconductor element, wherein the heatsink is disposed to partially overlap with the lead in a plan view, on an edge portion of a lower surface in a position, in the heatsink, overlapping with the lead in a plan view, at least one first convex portion protruding more than an edge portion of an upper surface in the position is formed, at least one cutting portion is formed in an edge portion of an upper surface in a position, in the heatsink, which does not overlap with the lead in a plan view, and the cutting portion is filled with the molding material.

A third embodiment of a technique disclosed in the specification of the present application includes: preparing a heatsink at least whose lower surface is grounded; locating, on an upper surface of the heatsink, a semiconductor element which a high-frequency signal is input to or output from; locating at least one lead electrically connected to the semiconductor element via a wire on an upper side of the heatsink; locating the heatsink to partially overlap with the lead in a plan view; forming, on an edge portion of a lower surface in a position, in the heatsink, overlapping with the lead in a plan view, at least one first convex portion protruding more than an edge portion of an upper surface in the position; forming, on an edge portion of an upper surface in a position, in the heatsink, which does not overlap with the lead in a plan view, at least one second convex portion protruding more than an edge portion of a lower surface in the position; forming a molding material covering part of the lead, part of the heatsink, and the semiconductor element; exposing at least an end portion of the first convex portion in the heatsink to form the molding material; and cutting the end portion of the first convex portion after forming the molding material.

Effects of the Invention

A first embodiment of a technique disclosed in the specification of the present application includes: a heatsink at least whose lower surface is grounded; a semiconductor element which is disposed on an upper surface of the heatsink and a high-frequency signal is input to or output from; at least one lead electrically connected to the semiconductor element via a wire and disposed on an upper side of the heatsink; and a molding material formed to cover part of the lead, at least an upper surface of the heatsink, and the semiconductor element, wherein the heatsink is disposed to partially overlap with the lead in a plan view, on an edge portion of a lower surface in a position, in the heatsink, overlapping with the lead in a plan view, at least one first convex portion protruding more than an edge portion of an upper surface in the position is formed, and on an edge portion of an upper surface in a position, in the heatsink, which does not overlap with the lead in a plan view, at least one second convex portion protruding more than an edge portion of a lower surface in the position is formed. According to such a configuration, the parasitic inductance component in the lateral direction of the heatsink is reduced in the position where the heatsink overlaps with the lead in a plan view. Reduced is the parasitic inductance component at the time when the parasitic capacitance between the lead and the heatsink is grounded via the heatsink. Accordingly, the impedance in the lead can be reduced. That is to say, the impedance in the lead connected to the semiconductor element can be reduced while achieving the effect of anchoring the molding material by the second convex portion.

A second embodiment of a technique disclosed in the specification of the present application includes: a heatsink at least whose lower surface is grounded; a semiconductor element which is disposed on an upper surface of the heatsink and a high-frequency signal is input to or output from; at least one lead electrically connected to the semiconductor element via a wire and disposed on an upper side of the heatsink; and a molding material formed to cover part of the lead, at least an upper surface of the heatsink, and the semiconductor element, wherein the heatsink is disposed to partially overlap with the lead in a plan view, on an edge portion of a lower surface in a position, in the heatsink, overlapping with the lead in a plan view, at least one first convex portion protruding more than an edge portion of an upper surface in the position is formed, at least one cutting portion is formed in an edge portion of an upper surface in a position, in the heatsink, which does not overlap with the lead in a plan view, and the cutting portion is filled with the molding material. According to such a configuration, the cutting portion in the heatsink is filled with the molding material, thus the effect of anchoring the heatsink and the molding material, that is to say, the anchor effect can be achieved. The parasitic inductance component in the lateral direction of the heatsink is reduced in the position where the heatsink overlaps with the lead in a plan view. Reduced is the parasitic inductance component at the time when the parasitic capacitance between the lead and the heatsink is grounded via the heatsink. Accordingly, the impedance in the lead can be reduced. That is to say, the impedance in the lead connected to the semiconductor element can be reduced while achieving the effect of anchoring the molding material by the cutting portion.

A third embodiment of a technique disclosed in the specification of the present application includes: preparing a heatsink at least whose lower surface is grounded; locating, on an upper surface of the heatsink, a semiconductor element which a high-frequency signal is input to or output from; locating at least one lead electrically connected to the semiconductor element via a wire on an upper side of the heatsink; locating the heatsink to partially overlap with the lead in a plan view; forming, on an edge portion of a lower surface in a position, in the heatsink, overlapping with the lead in a plan view, at least one first convex portion protruding more than an edge portion of an upper surface in the position; forming, on an edge portion of an upper surface in a position, in the heatsink, which does not overlap with the lead in a plan view, at least one second convex portion protruding more than an edge portion of a lower surface in the position; forming a molding material covering part of the lead, part of the heatsink, and the semiconductor element; exposing at least an end portion of the first convex portion in the heatsink to form the molding material; and cutting the end portion of the first convex portion after forming the molding material. According to such a configuration, the projection length of the lower side of the heatsink, that is to say, the lateral protrusion length of first convex portion is set to be long enough to be able to prevent the intrusion of the molding material, thus the intrusion of the molding resin around the side surface of the first convex portion or the lower surface of the heatsink can be suppressed. Accordingly, the semiconductor device capable of reducing the impedance in the lead while suppressing the intrusion of the molding resin can be manufactured.

These and other objects, features, aspects and advantages of the technique disclosed in the specification of the present application will become more apparent from the following detailed description of the present invention when taken in conjunction with the accompanying drawings.

DESCRIPTION OF EMBODIMENT(S)

Embodiments are described with reference to the appended drawings hereinafter.

The drawings a schematically illustrated, thus a configuration is appropriately omitted or simplified for convenience of explanation. A mutual relationship of sizes and positions of constituent elements respectively illustrated in the different drawings is not necessarily illustrated accurately, but may be appropriately changed.

In the description hereinafter, the same reference numerals will be assigned to the similar constituent elements in the drawings, and the constituent elements having the same reference numeral have the same name and function. Accordingly, the detailed description on them may be omitted to avoid a repetition in some cases.

In the following description, even when terms indicating a specific position and direction such as "upper", "lower", "left", "right", "side", "bottom", "front" or "rear" are stated, the terms are used to facilitate understanding of embodiments for convenience, and therefore, irrelevant to directions in practical implementation.

Further, in the following description, even when ordinal numbers such as "first" or "second" are stated, the terms are used to facilitate understanding of embodiments, and therefore, the usage of the ordinal numbers does not limit the indication of the ordinal numbers to ordering.

First Embodiment

Described hereinafter are a semiconductor device, a high-frequency power amplifier including the semiconductor device, and a method of manufacturing the semiconductor device according to the present embodiment. Described firstly for convenience of explanation is a package structure including a heatsink with a shape having a convex portion on an edge portion of an upper surface covered by a molding material so that the convex portion protrudes more than an edge portion of a lower surface exposed from the molding material.

Figure 10:
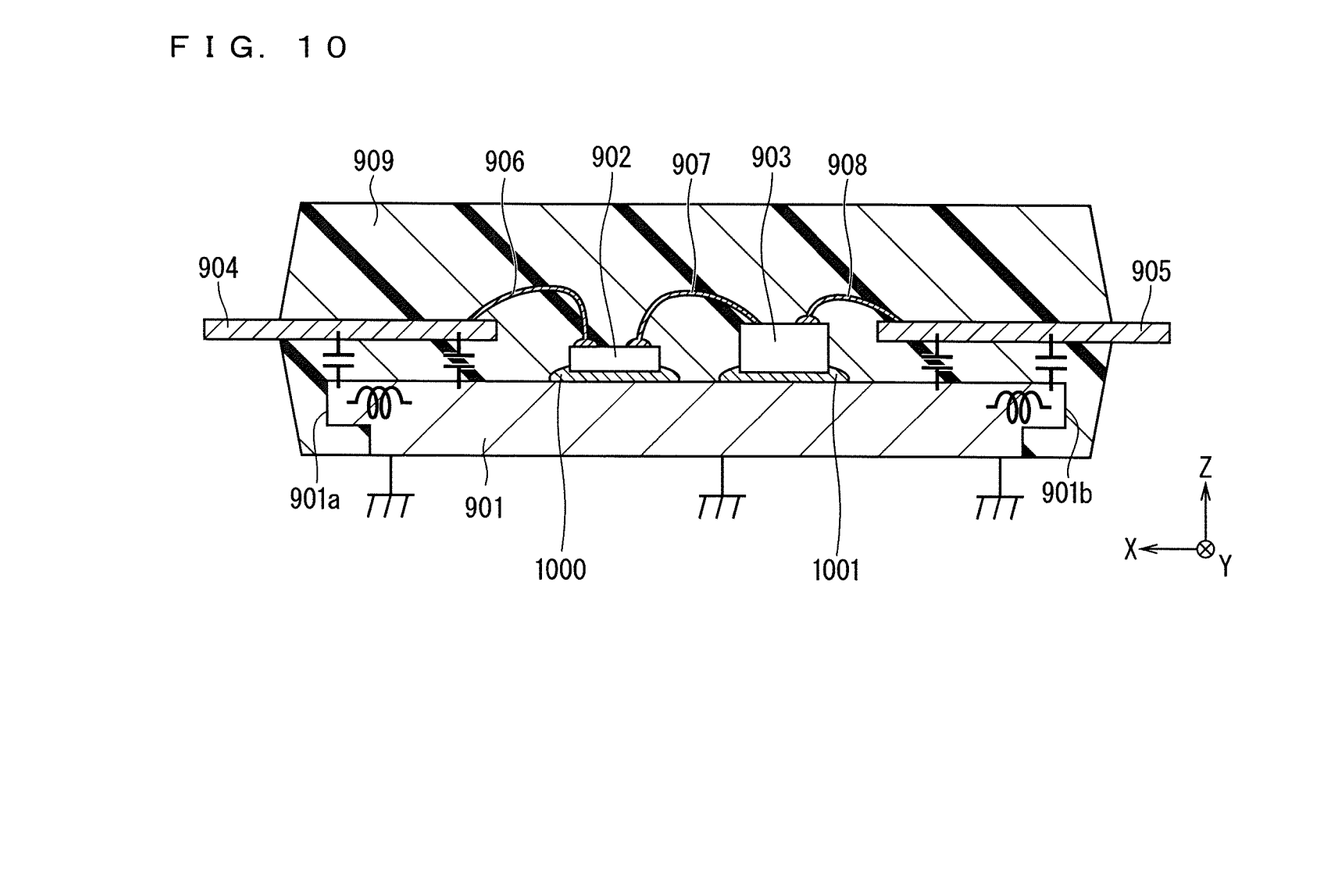
FIG. 10 A cross-sectional view illustrating a package structure including s heatsink with a shape having a convex portion on an edge portion of an upper surface covered by the molding material so that the convex portion protrudes more than an edge portion of a lower surface exposed from the molding material according to an embodiment.

FIG. 10 is a cross-sectional view illustrating a package structure including a heatsink with a shape having a convex portion on an edge portion of an upper surface covered by the molding material so that the convex portion protrudes more than an edge portion of a lower surface exposed from the molding material.

As illustrated in FIG. 10, the package structure includes a heatsink 901 made of metal, a semiconductor element 902 disposed on an upper surface of the heatsink 901 via a bonding material 1000, a matching element 903 disposed on the upper surface of the heatsink 901 via a bonding material 1001, a wire 907 electrically connecting the semiconductor element 902 and the matching element 903, a lead 904 electrically connected to the semiconductor element 902 via a wire 906 and also electrically connected to an external circuit (not shown herein), a lead 905 electrically connected to the matching element 903 via a wire 908 and also electrically connected to an external circuit (not shown herein), and a molding material 909 formed to cover the upper surface of the heatsink 901, the semiconductor element 902, the matching element 903, part of the lead 904, and part of the lead 905. The molding material 909 also has a function of protecting the semiconductor element 902 and the matching element 903 in the package structure from contact with an external circuit, for example.

A lower surface of the heatsink 901 is exposed from the molding material 909, and radiates heat generated from the semiconductor element 902 and the matching element 903.

The semiconductor element 902 is a high-frequency power amplifying element which a high-frequency signal is input to or output from, for example. The matching element 903 is an output matching circuit element of the semiconductor element 902, for example.

The heatsink 901 has a shape with a convex portion 901a and a convex portion 901b laterally protruding on an edge portion of the upper surface covered by the molding material 909, that is to say, a shape in which an upper side is longer than a lower side in FIG. 10 for purpose of anchoring the molding material 909 to the heatsink 901, that is to say, producing anchor effect.

In such a structure, a parasitic inductance component on a heatsink 901 side becomes redundant in a region where the lead 904 and the heatsink 901 overlap with each other in an up-down direction and a region where the lead 905 and the heatsink 901 overlap with each other in the up-down direction when the package structure is mounted on an external structure and the lower surface of the heatsink 901 is grounded. Thus, there is a problem that impedance in the lead 904 and the lead 905 cannot be reduced to a desired level.

<Configuration of Semiconductor Device>

Figure 1:
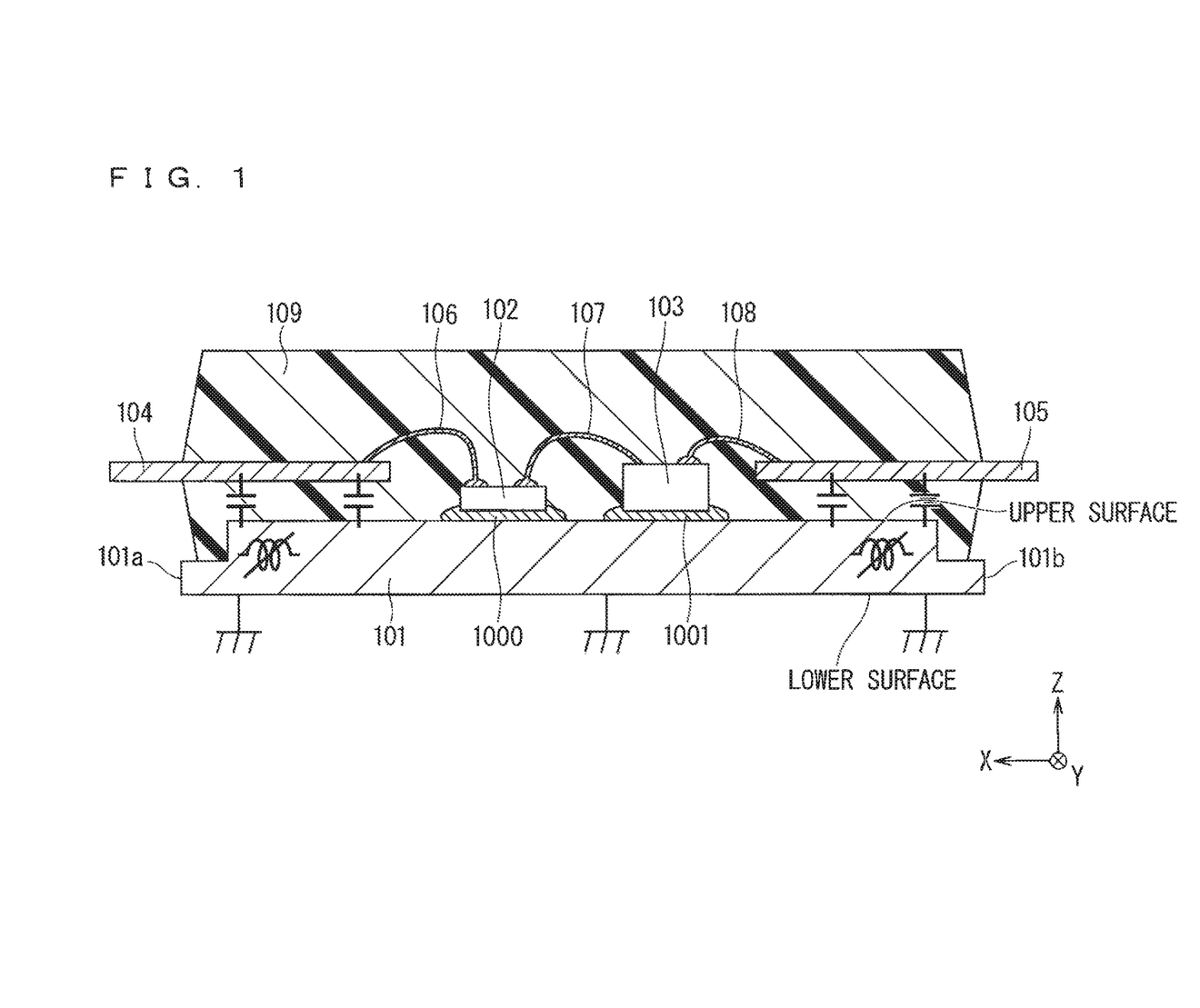
FIG. 1 A cross-sectional view along an X axis direction for schematically illustrating a configuration for achieving a semiconductor device according to an embodiment.

FIG. 1 is a cross-sectional view along an X axis direction for schematically illustrating a configuration for achieving a semiconductor device according to the present embodiment.

As illustrated in FIG. 1, the semiconductor device includes a heatsink 101 made of metal, a semiconductor element 102 disposed on an upper surface of the heatsink 101 via a bonding material 1000, a matching element 103 disposed on the upper surface of the heatsink 101 via a bonding material 1001, a wire 107 electrically connecting the semiconductor element 102 and the matching element 103, a lead 104 electrically connected to the semiconductor element 102 via a wire 106 and also electrically connected to an external circuit (not shown herein), a lead 105 electrically connected to the matching element 103 via a wire 108 and also electrically connected to an external circuit (not shown herein), and a molding material 109 formed to cover the upper surface of the heatsink 101, the semiconductor element 102, the matching element 103, part of the lead 104, and part of the lead 105. The molding material 109 also has a function of protecting the semiconductor element 102 and the matching element 103 in the package structure from contact with an external circuit, for example.

As illustrated in FIG. 1, the heatsink 101 has a convex portion 101a and a convex portion 101b laterally protruding on an edge portion of a lower surface of the heatsink 101 in a region where the heatsink 101 overlaps with the lead 104 or the lead 105 in an up-down direction, that is to say, in a position having the overlap in a plan view, and has a shape in which an upper side thereof is shorter than a lower side thereof. Thus, a parasitic inductance component on a heatsink 101 side hardly becomes redundant when the semiconductor device is mounted on an external structure and the lower surface of the heatsink 101 is grounded.

In the convex portion 101a in FIG. 1, an upper end and a lower end of the convex portion 101a protrude in the similar manner, however, a degree of protrusion of the upper end and the lower end of the convex portion 101a is not limited to be similar to each other. That is to say, it is also applicable that a protrusion amount of the upper end of the convex portion 101a is small and a protrusion amount of the lower end thereof is large, thus the convex portion 101a has an inclined shape (a tapered shape) in whole. In the similar manner, the convex portion 101b may also have an inclined shape (a tapered shape) in whole.

Figure 2:
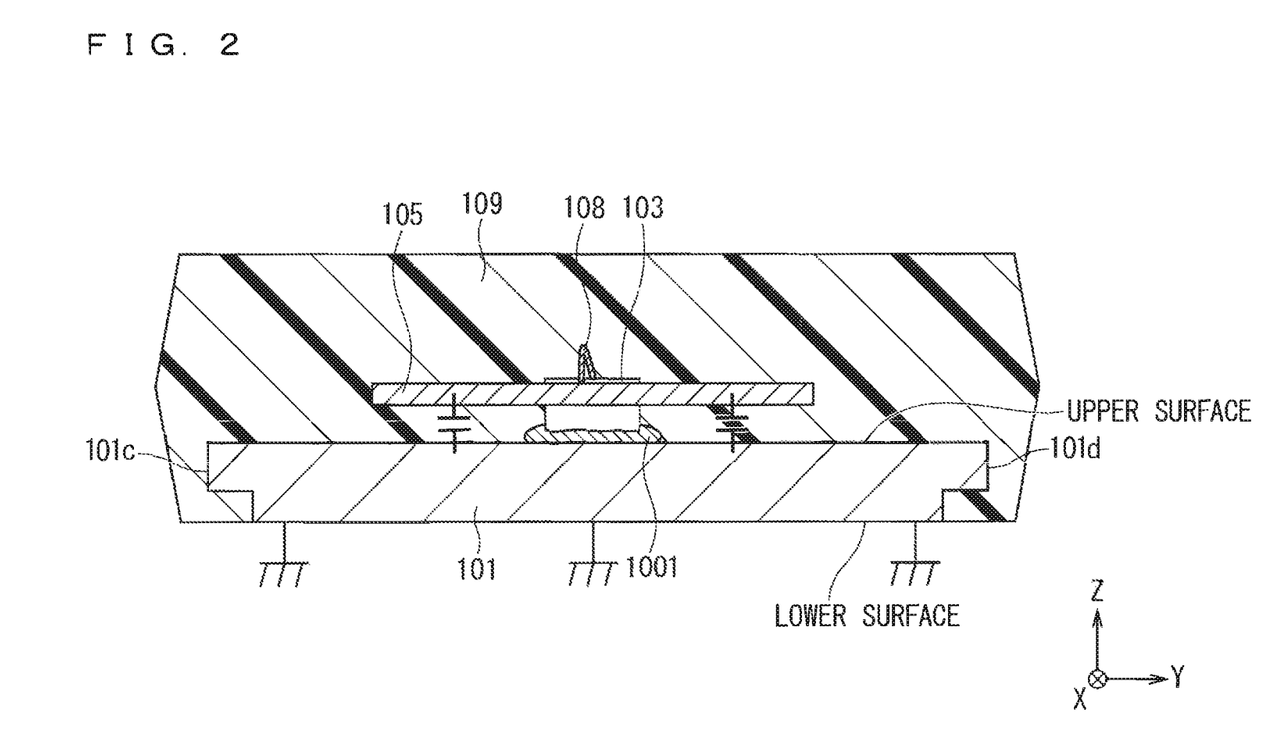
FIG. 2 A cross-sectional view along a Y axis direction for schematically illustrating a configuration for achieving the semiconductor device according to an embodiment.

FIG. 2 is a cross-sectional view along a Y axis direction for schematically illustrating a configuration for achieving the semiconductor device according to the present embodiment.

As illustrated in FIG. 2, the heatsink 101 has a shape with a convex portion 101c and a convex portion 101d laterally protruding on the edge portion of the upper surface covered by the molding material 109, that is to say, a shape in which the upper side is longer than the lower side in FIG. 2 for purpose of anchoring the molding material 109 to the heatsink 101, that is to say, producing the anchor effect.

In the convex portion 101c in FIG. 2, an upper end and a lower end of the convex portion 101c protrude in the similar manner, however, a degree of protrusion of the upper end and the lower end of the convex portion 101c is not limited to be similar to each other. In the similar manner, a degree of protrusion of an upper end and a lower end of the convex portion 101d is not limited to be similar to each other.

However, the convex portion 101c and the convex portion 101d in the heatsink 101 do not overlap with the lead 104 and the lead 105 in the up-down direction, thus do not prevent the lead 104 and the lead 105 from reducing the impedance.

The convex portion 101c and the convex portion 101d in the heatsink 101 illustrated in FIG. 2 are also formed in the similar manner in a cross-sectional view along the Y axis direction in a configuration in the other embodiment described hereinafter as an example unless otherwise mentioned.

Figure 3:
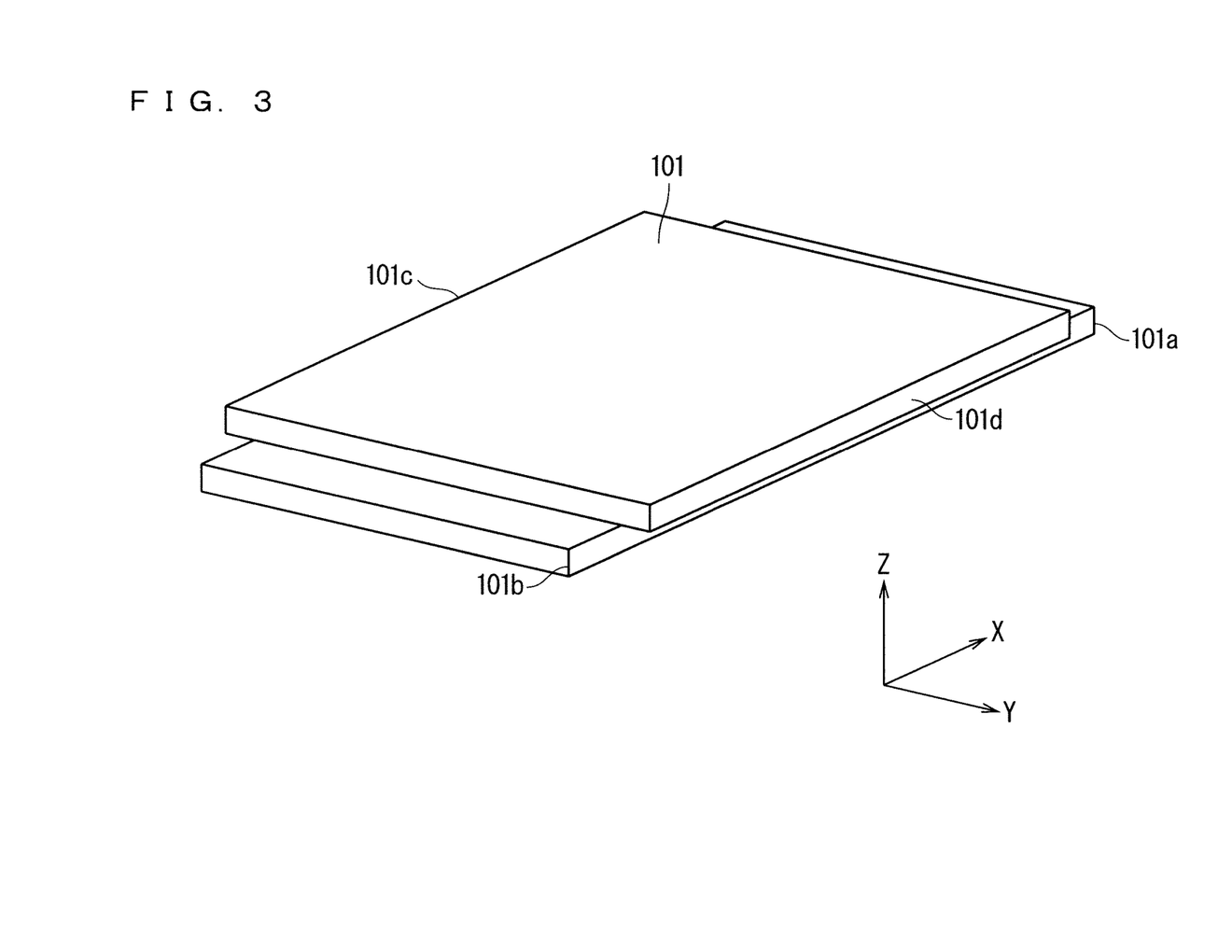
FIG. 3 A perspective view illustrating a configuration of a heatsink according to an embodiment.

FIG. 3 is a perspective view illustrating a configuration of the heatsink according to the present embodiment. Herein, a cross-sectional view along the X axis direction in FIG. 3 corresponds to FIG. 1. A cross-sectional view along the Y axis direction in FIG. 3 corresponds to FIG. 2.

According to the configuration illustrated in FIG. 1, the parasitic inductance component in a lateral direction of the heatsink 101 is reduced in a region where the heatsink 101 overlaps with the lead 104 or the lead 105 in the up-down direction. Reduced is the parasitic inductance component at a time when a parasitic capacitance between the lead 104 and the heatsink 101 and a parasitic capacitance between the lead 105 and the heatsink 101 are grounded via the heatsink 101. Accordingly, the impedance in the lead 104 and the lead 105 can be reduced.

As illustrated in FIG. 2, the heatsink 101 has the shape in which the upper side is longer than the lower side in the region where the heatsink 101 does not overlap with the lead 104 and the lead 105 in the up-down direction, thus the anchor effect can be achieved without preventing the reduction in the impedance in the lead 104 and the lead 105.

As described above, according to the present embodiment, achievable is both the reduction in the impedance in the lead 104 and the lead 105 and the effect of anchoring the heatsink 101 and the molding material 109, that is to say, the anchor effect.

Second Embodiment

Described are a semiconductor device, a high-frequency power amplifier including the semiconductor device, and a method of manufacturing the semiconductor device according to the present embodiment. In the description hereinafter, the same reference numerals as those described in the above embodiment will be assigned to the similar constituent elements in the drawings, and detailed description thereof is appropriately omitted.

<Configuration of Semiconductor Device>

Figure 4:
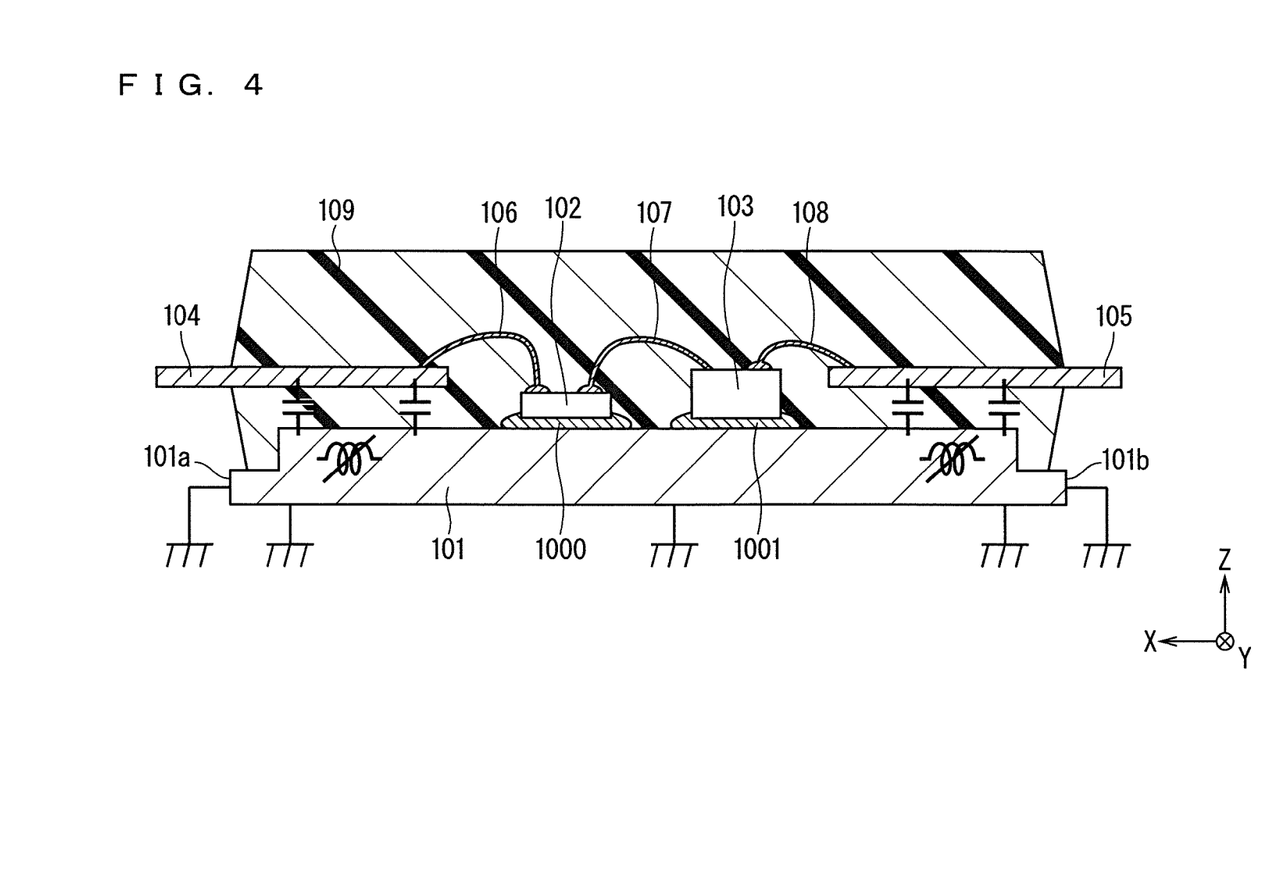
FIG. 4 A cross-sectional view along the X axis direction for schematically illustrating the configuration for achieving the semiconductor device according to an embodiment.

FIG. 4 is a cross-sectional view along the X axis direction for schematically illustrating a configuration for achieving the semiconductor device according to the present embodiment.

As illustrated in FIG. 4, the semiconductor device includes the heatsink 101, the semiconductor element 102, the matching element 103, the wire 106, the wire 107, the wire 108, the lead 104, the lead 105, and the molding material 109.

Herein, when the semiconductor device is mounted on an external structure, in the heatsink 101, the lower surface and the convex portions 101a and 101b which are the convex portions laterally protruding on the edge portion of the lower surface are grounded.

According to the structure illustrated in FIG. 4, not only the lower surface of the heatsink 101 but also the convex portion 101a and the convex portion 101b are grounded, thus further reduced is the parasitic inductance component at the time when the parasitic capacitance between the lead 104 and the heatsink 101 and the parasitic capacitance between the lead 105 and the heatsink 101 are grounded via the heatsink 101.

The configuration of grounding the convex portion 101a and the convex portion 101b in the heatsink 101 illustrated in FIG. 4 are also formed in the similar manner in a configuration in the other embodiment described hereinafter as an example unless otherwise mentioned.

Third Embodiment

Described are a semiconductor device, a high-frequency power amplifier including the semiconductor device, and a method of manufacturing the semiconductor device according to the present embodiment. In the description hereinafter, the same reference numerals as those described in the above embodiment will be assigned to the similar constituent elements in the drawings, and detailed description thereof is appropriately omitted.

<Configuration of Semiconductor Device>

Figure 5:
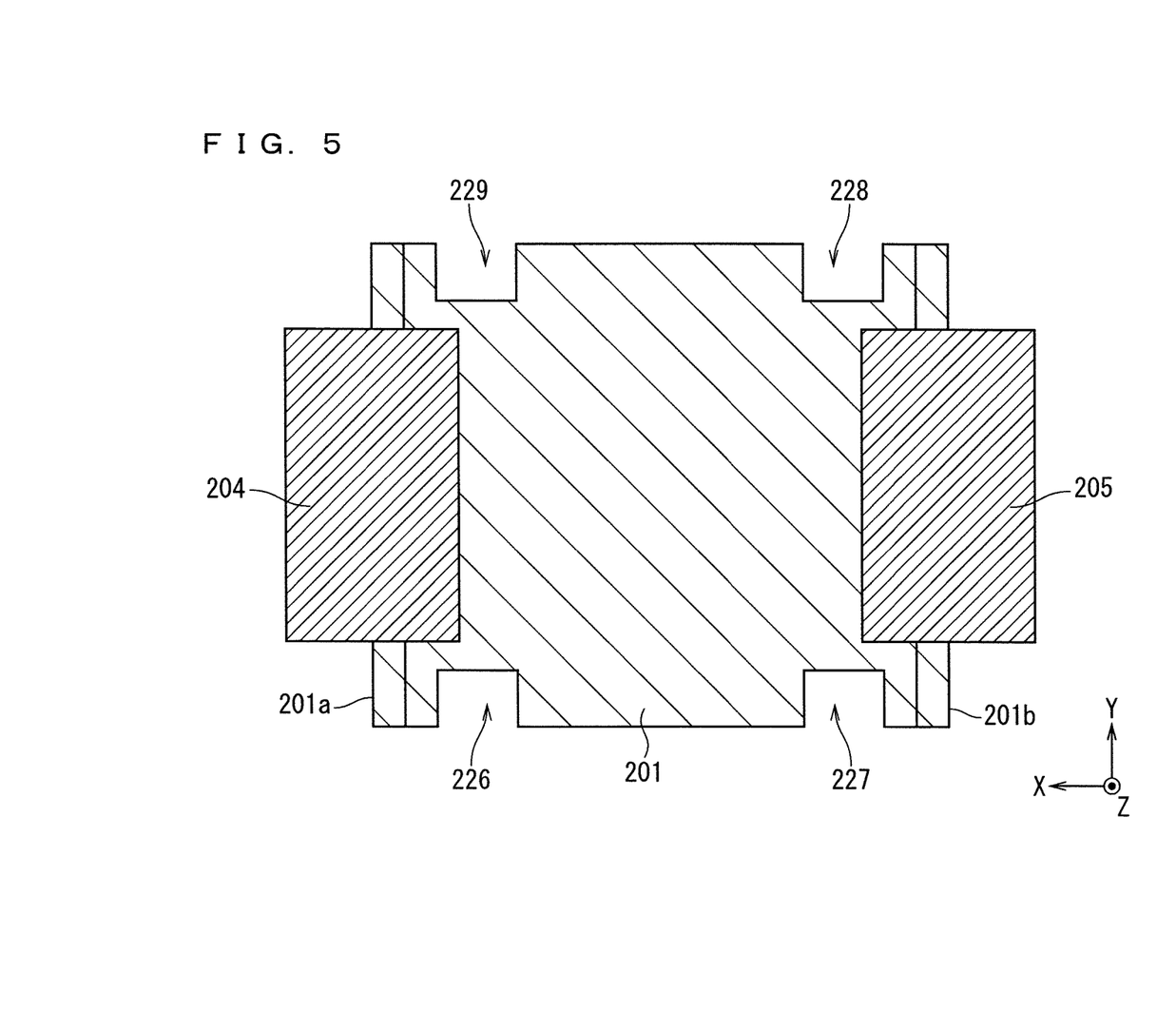
FIG. 5 A plan view illustrating a shape of the heatsink according to an embodiment.

FIG. 5 is a plan view illustrating a shape of the heatsink in a semiconductor device according to the present embodiment. As illustrated in FIG. 5, in a heatsink 201, a cutting portion 226, a cutting portion 227, a cutting portion 228, and a cutting portion 229 are provided in regions which do not overlap with a lead 204 and a lead 205 in a plan view.

In FIG. 5, the convex portion 201a and the convex portion 201b are laterally formed on an edge portion of a lower surface of the heatsink 201, and the cutting portion 226, the cutting portion 227, the cutting portion 228, and the cutting portion 229 are formed in sides where the convex portion 201a and the convex portion 201b are not formed.

The convex portion 101c and the convex portion 101d illustrated in FIG. 2 are not formed in the heatsink 201 illustrated in FIG. 5, however, the convex portion 101c and the convex portion 101d illustrated in FIG. 2 may further be formed therein.

Figure 6:
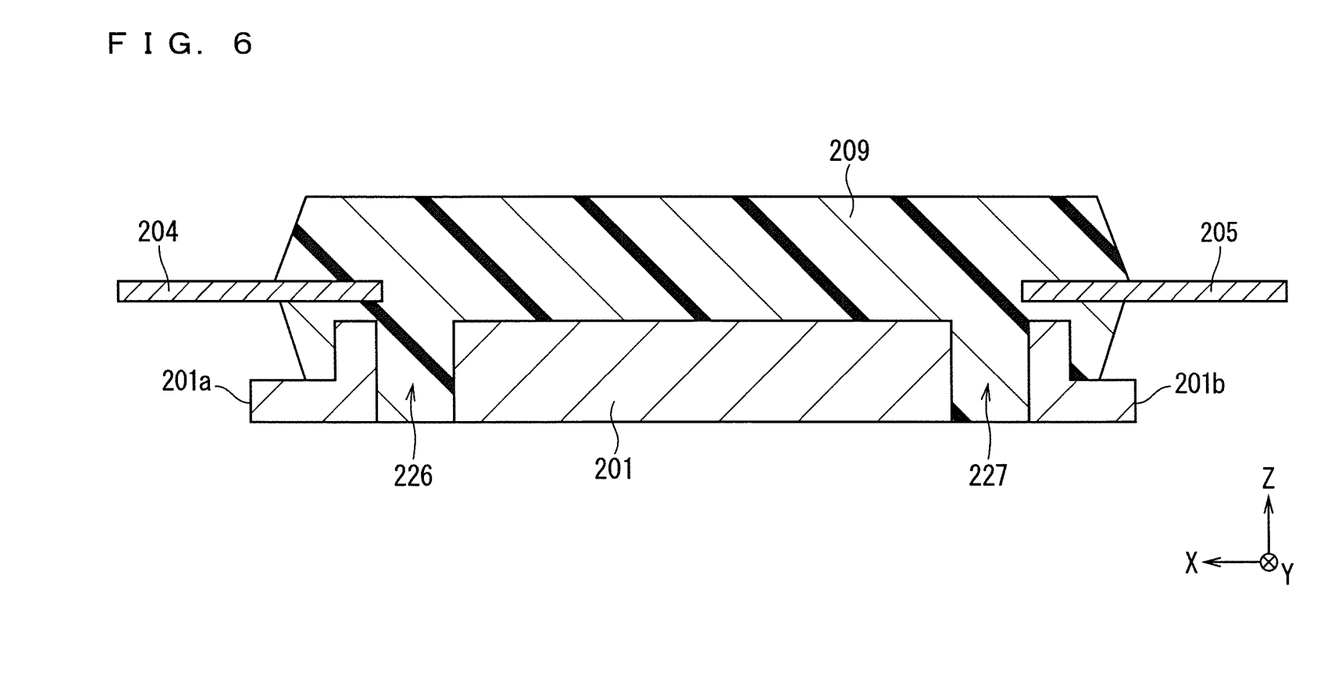
FIG. 6 A cross-sectional view illustrating a structure of covering and fixing the heatsink and a lead illustrated in FIG. 5 by a molding material.

FIG. 6 is a cross-sectional view illustrating a structure of covering and fixing the heatsink 201, the lead 204, and the lead 205 illustrated in FIG. 5 by a molding material 209. An illustration of a semiconductor element and a matching element covered by the molding material 209 is omitted for simplifying the drawing.

According to the structure illustrated in FIG. 5 and FIG. 6, the cutting portion 226, the cutting portion 227, the cutting portion 228, and the cutting portion 229 in the heatsink 201 are filled with the molding material 209, thus the effect of anchoring the heatsink 201 and the molding material 209, that is to say, the anchor effect can be achieved.

In the convex portion 201a in FIG. 6, an upper end and a lower end of the convex portion 201a protrude in the similar manner, however, a degree of protrusion of the upper end and the lower end of the convex portion 201a is not limited to be similar to each other. That is to say, it is also applicable that a protrusion amount of the upper end of the convex portion 201a is small and a protrusion amount of the lower end thereof is large, thus the convex portion 201a has an inclined shape (a tapered shape) in whole. In the similar manner, the convex portion 201b may also have an inclined shape (a tapered shape) in whole.

Fourth Embodiment

Described are a semiconductor device, a high-frequency power amplifier including the semiconductor device, and a method of manufacturing the semiconductor device according to the present embodiment. In the description hereinafter, the same reference numerals as those described in the above embodiment will be assigned to the similar constituent elements in the drawings, and detailed description thereof is appropriately omitted.

<Configuration of Semiconductor Device>

Figure 7:
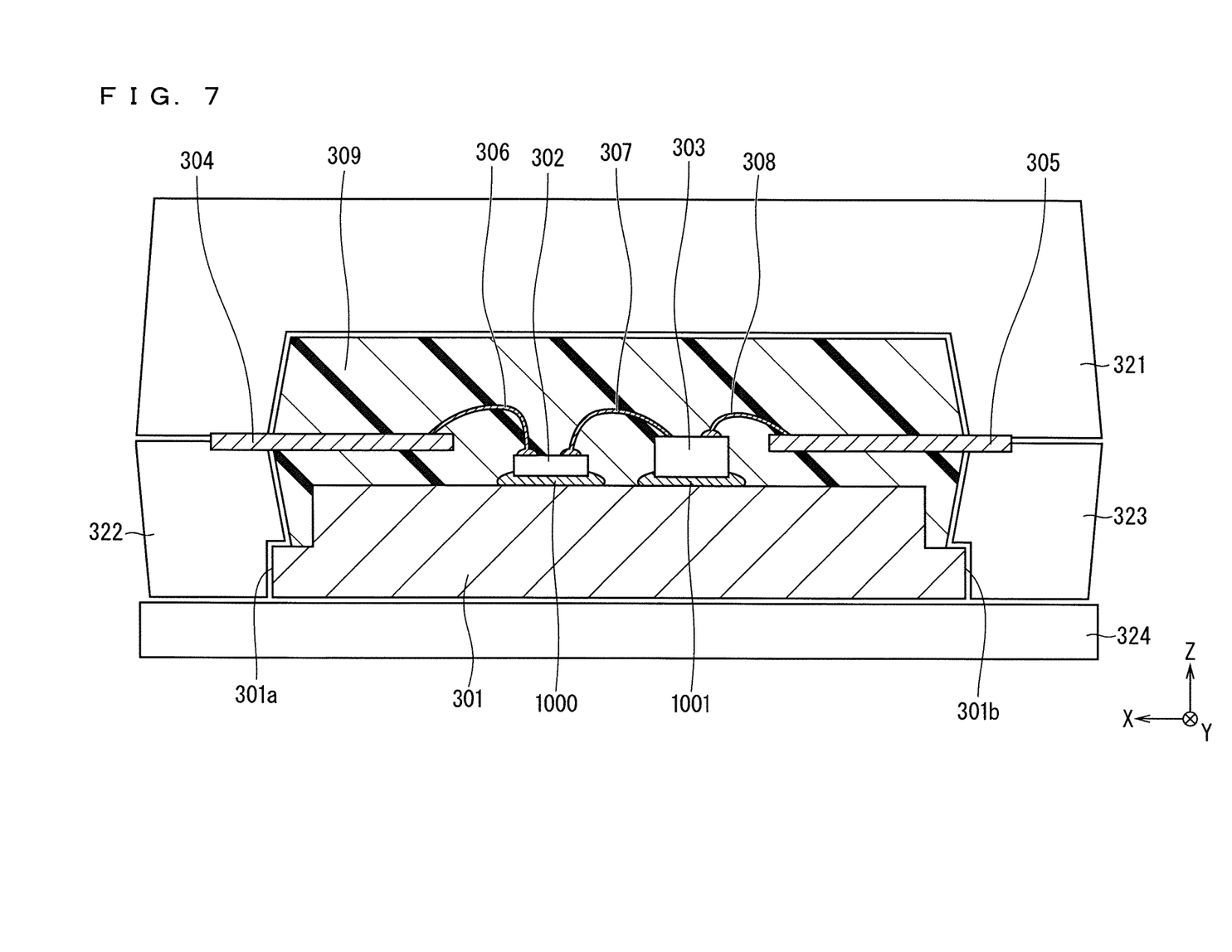
FIG. 7 A cross-sectional view along the X axis direction for schematically illustrating the configuration for achieving the semiconductor device according to an embodiment.

FIG. 7 is a cross-sectional view along the X axis direction for schematically illustrating a configuration for achieving the semiconductor device according to the present embodiment. FIG. 7 illustrates a mold shape used in a process of sealing with the molding material in the semiconductor device.

As illustrated in FIG. 7, the semiconductor device includes a heatsink 301, a semiconductor element 302, a matching element 303, a wire 306, a wire 307, a wire 308, a lead 304, a lead 305, and a molding material 309.

In FIG. 7, a convex portion 301a and a convex portion 301b are laterally formed on an edge portion of a lower surface of the heatsink 301.

An upper surface side mold 321, a lower surface side mold 322, and a lower surface side mold 323 are used in the process of sealing with the molding material 309. A support substrate 324 is a substrate supporting the heatsink 301.

In a case illustrated in FIG. 7, the heatsink 301 whose lower surface is grounded is prepared firstly. Then, the semiconductor element 302 and the matching element 303 are disposed on an upper surface of the heatsink 301 via a bonding material. Then, the lead 304 electrically connected to the semiconductor element 302 via the wire 306 and the lead 305 electrically connected to the matching element 303 via the wire 308 are disposed on an upper side of the heatsink 301.

Herein, the heatsink 301 are disposed to partially overlap with the lead 304 and the lead 305 in a plan view. Formed on an edge portion of a lower surface in a position, in the heatsink 301, overlapping with the lead 304 in a plan view is a convex portion 301a protruding more than an edge portion of an upper surface in the position. Formed on the edge portion of the lower surface in a position, in the heatsink 301, overlapping with the lead 305 in a plan view is a convex portion 301b protruding more than the edge portion of the upper surface in the position.

Formed on the edge portion of the upper surface in a position, in the heatsink 301, not overlapping with the lead 304 in a plan view is the convex portion 101c protruding more than the edge portion of the lower surface in the position (refer to FIG. 2). Formed on the edge portion of the upper surface in a position, in the heatsink 301, not overlapping with the lead 305 in a plan view is the convex portion 101d protruding more than the edge portion of the lower surface in the position (refer to FIG. 2).

Formed then is the molding material 309 covering part of the lead 304, part of the heatsink 301, and the semiconductor element 302. Herein, the molding material 309 is formed in such a manner as to expose at least an end portion of each of the convex portion 301a and the convex portion 301b in the heatsink 301.

The support substrate 324 supporting the upper surface side mold 321, the lower surface side mold 322, the lower surface side mold 323, and the heatsink 301 are used, thus the semiconductor device according to the present embodiment, for example, a high-frequency power amplifier can be manufactured.

Fifth Embodiment

Described are a semiconductor device, a high-frequency power amplifier including the semiconductor device, and a method of manufacturing the semiconductor device according to the present embodiment. In the description hereinafter, the same reference numerals as those described in the above embodiment will be assigned to the similar constituent elements in the drawings, and detailed description thereof is appropriately omitted.

<Configuration of Semiconductor Device>

Figure 8:
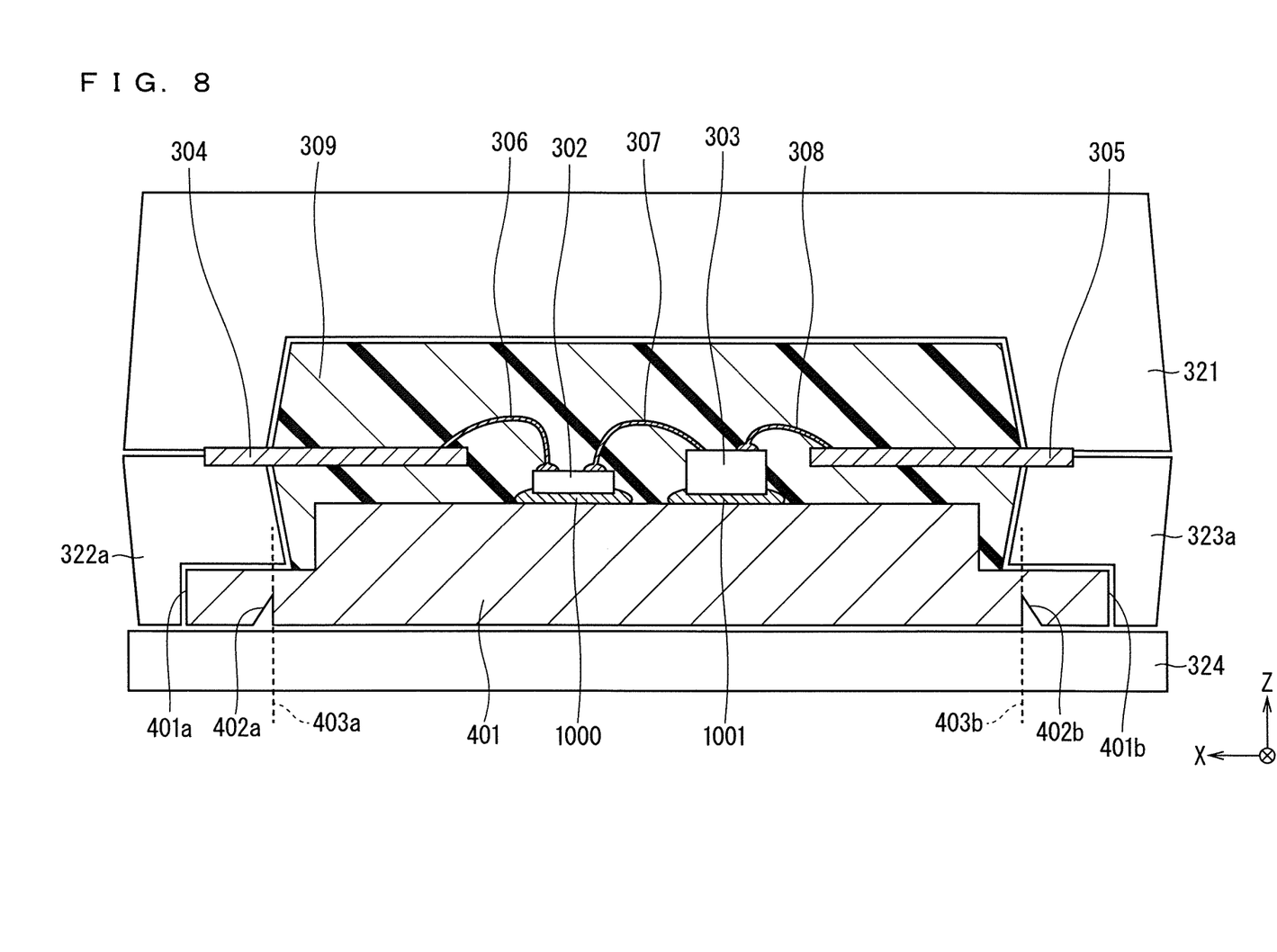
FIG. 8 A cross-sectional view along the X axis direction for schematically illustrating the configuration for achieving the semiconductor device according to an embodiment.

FIG. 8 is a cross-sectional view along the X axis direction for schematically illustrating a configuration for achieving the semiconductor device according to the present embodiment. FIG. 8 illustrates a mold shape used in a process of sealing with the molding material in the semiconductor device.

As illustrated in FIG. 8, the semiconductor device includes a heatsink 401, the semiconductor element 302, the matching element 303, the wire 306, the wire 307, the wire 308, the lead 304, the lead 305, and the molding material 309.

The upper surface side mold 321, a lower surface side mold 322a, and a lower surface side mold 323a are used in the process of sealing with the molding material 309. The support substrate 324 is the substrate supporting the heatsink 401.

In FIG. 8, a convex portion 401a and a convex portion 401b are laterally formed on an edge portion of a lower surface of the heatsink 401.

A shape of the mold and the heatsink 401 in FIG. 8 suppresses an intrusion of the molding material 309 around a side surface of the convex portion 401a, a side surface of the convex portion 401b, or a lower surface of the heatsink 401 in the process of sealing with the molding material 309.

Specifically, the heatsink 401 includes a notch 402a formed in a lower surface of the convex portion 401a and a notch 402b formed in a lower surface of the convex portion 401b. A projection length of the lower surface of the heatsink 401, that is to say, a lateral protrusion length of each convex portion is set to be long enough to be able to prevent the intrusion of the molding material 309.

After the sealing with a molding resin of the molding material 309, the upper surface side mold 321, the lower surface side mold 322a, the lower surface side mold 323a, and the support substrate 324 used in the process of sealing with the molding material 309 are removed, and subsequently, part of the heatsink 401 is cut at a position 403a and a position 403b, starting from the notch 402a and the notch 402b. Specifically, part of the convex portion 401a and part of the convex portion 401b are cut.

Figure 9:
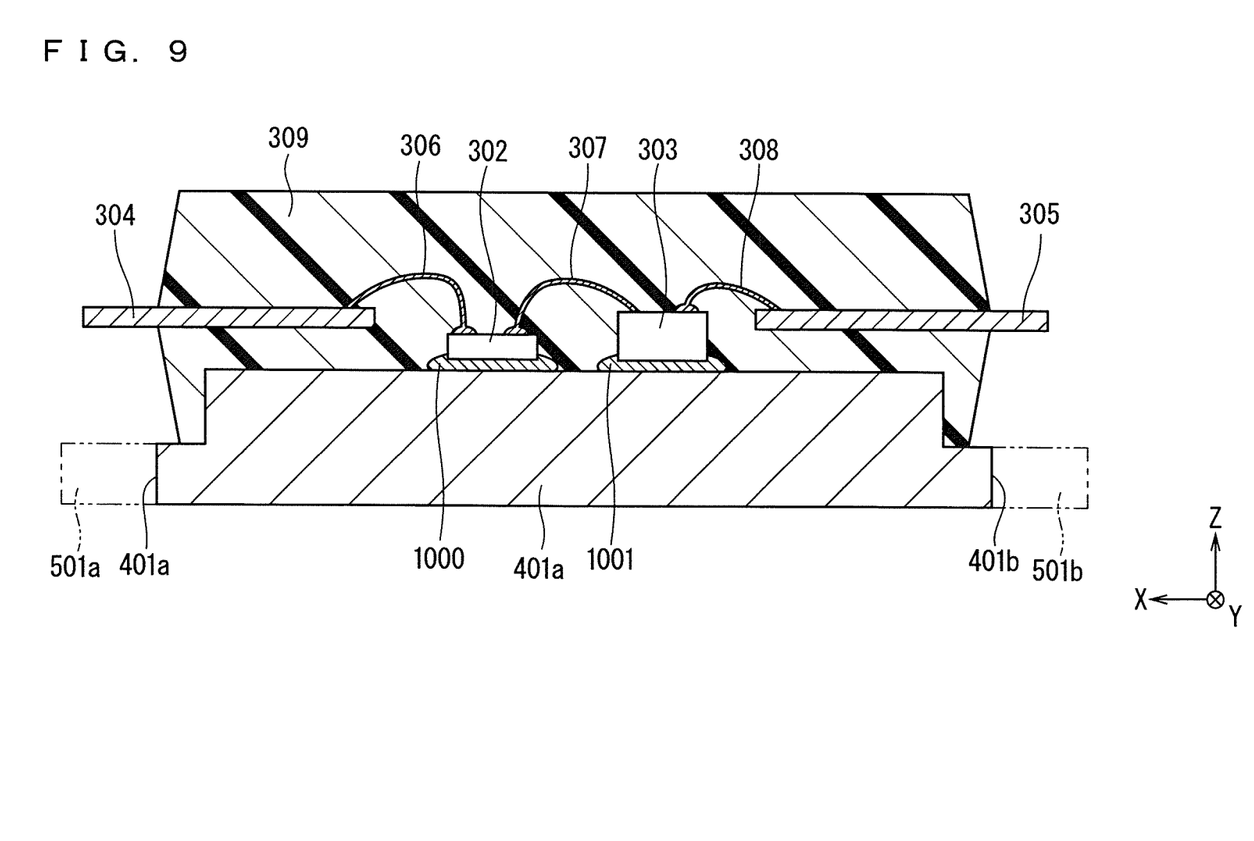
FIG. 9 A drawing illustrating an outer shape of a package after being cut in a process subsequent to a formation of a molding material resin according to an embodiment.

FIG. 9 is a drawing illustrating an outer shape of a package after being cut in the process subsequent to the formation of the molding material resin. In FIG. 9, a region 501a and a region 501b correspond to the parts of the heatsink which has been cut, specifically to portions where the part of the convex portion 401a and the part of the convex portion 401b used to be, respectively.

The projection length of the lower side of the heatsink 401, that is to say, the lateral protrusion length of each convex portion is set to be long enough to be able to prevent the intrusion of the molding material 309, thus the intrusion of the molding resin around the side surface of the convex portion 401a, the side surface of the convex portion 401b, or the lower surface of the heatsink 401 can be suppressed.

Accordingly, the impedance in the lead 304 and the lead 305 in FIG. 8 can be reduced while suppressing the intrusion of the molding resin.

Effects Generated by Embodiments Described Above

Effects generated by the above described embodiments are described next. It should be noted that, in the following description, the effects are described based on the specific configurations illustrated in the above described embodiments, however, other specific configurations may be applied in place of the configurations illustrated in the specification, within the scope of producing the similar effects.

Also, the replacement may be implemented with a plurality of embodiments. That is to say, each of the configurations illustrated in the corresponding embodiments may be combined with one another to produce the similar effects.

According to the embodiment described above, the semiconductor device includes the heatsink 101, the semiconductor element 102, at least one lead 104, and the molding material 109. At least the lower surface of the heatsink 101 is grounded. The semiconductor element 102 is disposed on the upper surface of the heatsink 101. The high-frequency signal is input to or output from the semiconductor element 102. The lead 104 is electrically connected to the semiconductor element 102 via the wire 106. The lead 104 is disposed on the upper side of the heatsink 101. Formed is the molding material 109 covering the part of the lead 104, at least the upper surface of the heatsink 101, and the semiconductor element 102. Herein, the heatsink 101 is disposed to partially overlap with the lead 104 in a plan view. Formed on the edge portion of the lower surface in the position, in the heatsink 101, overlapping with the lead 104 in a plan view is at least first convex portion protruding more than the edge portion of the upper surface in the position. Formed on the edge portion of the upper surface in the position, in the heatsink 101, not overlapping with the lead 104 in a plan view is at least second convex portion protruding more than the edge portion of the lower surface in the position. Herein, the first convex portion corresponds to at least one of the convex portion 101a, the convex portion 201a, the convex portion 101b, and the convex portion 201b, for example. The second convex portion corresponds to at least one of the convex portion 101c and the convex portion 101d, for example.

According to such a configuration, the parasitic inductance component in the lateral direction of the heatsink 101 is reduced in the region where the heatsink 101 overlaps with the lead 104 in the up-down direction. Reduced is the parasitic inductance component at the time when the parasitic capacitance between the lead 104 and the heatsink 101 is grounded via the heatsink 101. Accordingly, the impedance in the lead 104 can be reduced. That is to say, the impedance in the lead connected to the semiconductor element 102 can be reduced while achieving the effect of anchoring the molding material by the convex portion 101c and the convex portion 101d.

It should be noted that the description of the other configurations other than the configurations illustrated in the specification of the present application can be appropriately omitted. That is to say, as long as the described configurations are provided, the above described effects can be produced.

However, even in the case where at least one of the other configurations other than the configurations illustrated in the specification of the present application is appropriately added to the configuration described above, that is to say, other configurations other than the configurations illustrated in the specification of the present application, which are not referred to as configurations described above are appropriately added, the similar effects can be produced.

According to the embodiment described above, the convex portion 101a in the heatsink 101 is exposed from the molding material 109. The lower surface and the convex portion 101a in the heatsink 101 are grounded. According to such a configuration, not also the lower surface but also the convex portion 101a in the heatsink 101 are grounded, thus further reduced is the parasitic inductance component at the time when the parasitic capacitance between the lead 104 and the heatsink 101 is grounded via the heatsink 101.

According to the embodiments described above, at least one cutting portion 226 is formed in the edge portion of the upper surface in the position, in the heatsink 201, which does not overlap with the lead 204 in a plan view. Then, the cutting portion 226 is filled with the molding material 209. According to such a configuration, the cutting portion 226 in the heatsink 201 is filled with the molding material 209, thus the effect of anchoring the heatsink 201 and the molding material 209, that is to say, the anchor effect can be achieved.

According to the embodiment described above, the semiconductor device includes the heatsink 201, the semiconductor element 102, at least one lead 204, and the molding material 209. At least the lower surface of the heatsink 201 is grounded. The semiconductor element 102 is disposed on the upper surface of the heatsink 201, and the high-frequency signal is input to or output from the semiconductor element 102. The lead 204 is electrically connected to the semiconductor element 102 via the wire 106. The lead 204 is disposed on the upper side of the heatsink 201. Formed is the molding material 209 covering the part of the lead 204, at least the upper surface of the heatsink 201, and the semiconductor element 102. Herein, the heatsink 201 is disposed to partially overlap with the lead 204 in a plan view. Formed on the edge portion of the lower surface in the position, in the heatsink 201, overlapping with the lead 204 in a plan view is at least one convex portion 201a protruding more than the edge portion of the upper surface in the position. At least one cutting portion 226 is formed in the edge portion of the upper surface in the position, in the heatsink 201, which does not overlap with the lead 204 in a plan view. Then, the cutting portion 226 is filled with the molding material 209.

According to such a configuration, the cutting portion 226 in the heatsink 201 is filled with the molding material 209, thus the effect of anchoring the heatsink 201 and the molding material 209, that is to say, the anchor effect can be achieved. The parasitic inductance component in the lateral direction of the heatsink 201 is reduced in the region where the heatsink 201 overlaps with the lead 204 in the up-down direction. Reduced is the parasitic inductance component at the time when the parasitic capacitance between the lead 204 and the heatsink 201 is grounded via the heatsink 201. Accordingly, the impedance in the lead 204 can be reduced. That is to say, the reduction in the impedance in the lead connected to the semiconductor element 102 can be achieved while achieving the effect of anchoring the molding material by the cutting portion 226.

It should be noted that the description of the other configurations other than the configurations illustrated in the specification of the present application can be appropriately omitted. That is to say, as long as the described configurations are provided, the above described effects can be produced.

However, even in the case where at least one of the other configurations other than the configurations illustrated in the specification of the present application is appropriately added to the configuration described above, that is to say, other configurations other than the configurations illustrated in the specification of the present application, which are not referred to as configurations described above are appropriately added, the similar effects can be produced.

According to the embodiment described above, the convex portion 201a in the heatsink 201 is exposed from the molding material 209. The lower surface and the convex portion 201a in the heatsink 201 are grounded. According to such a configuration, not also the lower surface but also the convex portion 201a in the heatsink 201 are grounded, thus further reduced is the parasitic inductance component at the time when the parasitic capacitance between the lead 204 and the heatsink 201 is grounded via the heatsink 201.

According to the embodiment described above, the high-frequency power amplifier includes the semiconductor device described above. According to such a configuration, the impedance in the lead can be reduced, thus the high-frequency performance can be enhanced.

According to the embodiments described above, the heatsink 401 at least whose lower surface is grounded is prepared in the method of manufacturing the semiconductor device. Then, disposed on the upper surface of the heatsink 401 is the semiconductor element 302 which the high-frequency signal is input to or output from. Then, at least one lead 304 electrically connected to the semiconductor element 302 via the wire 306 is disposed on the upper side of the heatsink 401. Herein, the heatsink 401 is disposed to partially overlap with the lead 304 in a plan view. Formed on the edge portion of the lower surface in the position, in the heatsink 401, overlapping with the lead 304 in a plan view is at least one first convex portion protruding more than the edge portion of the upper surface in the position. Formed on the edge portion of the upper surface in the position, in the heatsink 403, which does not overlap with the lead 304 in a plan view is at least one second convex portion protruding more than the edge portion of the lower surface in the position. Formed then is the molding material 309 covering the part of the lead 304, the part of the heatsink 401, and the semiconductor element 302. Herein, the molding material 309 is formed in such a manner as to expose at least the end portion of the first convex portion in the heatsink 401. Then, the end portion of the first convex portion is cut after forming the molding material 309. Herein, the first convex portion corresponds to at least one of the convex portion 401a and the convex portion 401b, for example. The second convex portion corresponds to at least one of the convex portion 101c and the convex portion 101d, for example.

According to such a configuration, the projection length of the lower side of the heatsink 401, that is to say, the lateral protrusion length of each of the convex portion 401a and the convex portion 401b is set to be long enough to be able to prevent the intrusion of the molding material 309, thus the intrusion of the molding resin around the side surface of the convex portion 401a, the side surface of the convex portion 401b, or the lower surface of the heatsink 401 can be suppressed. Accordingly, the semiconductor device capable of reducing the impedance in the lead 304 and the lead 305 while suppressing the intrusion of the molding resin can be manufactured.

It should be noted that the description of the other configurations other than the configurations illustrated in the specification of the present application can be appropriately omitted. That is to say, as long as the described configurations are provided, the above described effects can be produced.

However, even in the case where at least one of the other configurations other than the configurations illustrated in the specification of the present application is appropriately added to the configuration described above, that is to say, other configurations other than the configurations illustrated in the specification of the present application, which are not referred to as configurations described above are appropriately added, the similar effects can be produced.

The order of performing each processing can be changed unless there is a specific limitation.

According to the embodiments described above, the end portion of the convex portion 401a is cut from the notch 402a in the convex portion 401a. According to such a configuration, a tip portion of the convex portion 401a can be easily cut from a predetermined position.

Modification Example in Embodiments Described Above

In the embodiments described above, material properties, materials, dimensions, shapes, relative arrangement relations, conditions for implementation, and so forth for the respective constituent elements may be described, however, these represent a mare example in all aspects, and are not limited to the description in the specification of the present application.

Accordingly, it is understood that numerous other modifications variations, and equivalents can be devised without departing from the scope of the technique disclosed in the specification of the present application. For example, the following cases where at least one of the constituent elements is to be modified, added, or omitted, further, at least one of the constituent elements of at least one of the embodiments is extracted and then combined with constituent elements of the other embodiment, are involved.

The "one" constituent element described in the above embodiments may be "one or more" constituent elements so far as consistent with the embodiments.

Further, individual constituent elements are conceptual units. Thus, within the range of the technique disclosed in the specification of the present application, one constituent element may include multiple structures, one constituent element may correspond to part of some structure, and multiple constituent elements may be included in one structure.

Each constituent element includes a structure having a different configuration or a different shape as long as the structure of the different configuration or the different shape achieves the same function.

What has been described in the specification of the present application is referred for all purposes regarding the present technique. It is thus not an admission that any of the descriptions provided herein are conventional techniques.

Further, in the embodiments described above, when names of materials are stated unless otherwise specified, an alloy of the material and other additives, and so forth are included, so far as consistent with the embodiments.

EXPLANATION OF REFERENCE SIGNS 101, 201, 301, 401, and 901 heatsink, 101a, 101b, 101c, 101d, 201a, 201b, 301a, 301b, 401a, 401b, 901a, and 901b convex portion, 102, 302, and 902 semiconductor element, 103, 303, and 903 matching element, 104, 105, 204, 205, 304, 305, 904, and 905 lead, 106, 107, 108, 306, 307, 308, 906, 907, and 908 wire, 109, 209, 309, and 909 molding material, 226, 227, 228, and 229 cutting portion, 321 upper surface side mold, 322, 322a, 323, and 323a lower surface side mold, 324 support substrate, 402a and 402b notch, 403a and 403b position, 501a and 501b region, 1000 and 1001 bonding material

The invention claimed is:

1. A semiconductor device, comprising:
a heatsink at least whose lower surface is grounded;
a semiconductor element which is disposed on an upper surface of the heatsink and is configured to receive as input or to output a high-frequency signal;
at least one lead electrically connected to the semiconductor element via a wire and disposed on an upper side of the heatsink; and
a molding material formed to cover part of the lead, at least the upper surface of the heatsink, and the semiconductor element, wherein
the heatsink is disposed to be partially overlapped by the lead in a plan view,
an edge portion of the lower surface of the heatsink that is overlapped by the lead in a plan view protrudes beyond an edge portion of the upper surface of the heatsink, forming at least one first convex portion, and
the edge portion of the upper surface of the heatsink that is not overlapped by the lead in a plan view protrudes beyond the edge portion of the lower surface of the heatsink, forming at least one second convex portion.

2. The semiconductor device according to claim 1, wherein
the at least one first convex portion in the heatsink is exposed from the molding material, and
the lower surface and the first convex portion in the heatsink are grounded.

3. The semiconductor device according to claim 1, wherein
at least one cutting portion is formed in the upper surface the heatsink in a plan view,
the at least one cutting portion is not overlapped by the lead in a plan view, and
the cutting portion is filled with the molding material.

4. A high-frequency power amplifier, comprising the semiconductor device according to claim 1.

5. A method of manufacturing a semiconductor device, comprising:
preparing a heatsink at least whose lower surface is grounded;
locating, on an upper surface of the heatsink, a semiconductor element configured to receive as input or to output a high-frequency signal;
locating at least one lead electrically connected to the semiconductor element via a wire on an upper side of the heatsink;
locating the heatsink to be partially overlapped by the lead in a plan view;
forming at least one first convex portion in the heatsink in which an edge portion of the lower surface of the heatsink that is overlapped by the lead in a plan view protrudes beyond an edge portion of the upper surface of the heatsink;
forming at least one second convex portion in the heatsink in which the edge portion of the upper surface of the heatsink that is not overlapped by the lead in a plan view protrudes beyond the edge portion of the lower surface of the heatsink;
forming a molding material covering part of the lead, part of the heatsink, and the semiconductor element;
exposing at least an end portion of the first convex portion in the heatsink to form the molding material; and
cutting the end portion of the first convex portion after forming the molding material.

6. The method of manufacturing the semiconductor device according to claim 5, wherein
an end portion of the first convex portion is cut from a notch in the first convex portion.

7. The semiconductor device according to claim 2, wherein
at least one cutting portion is formed in the upper surface the heatsink in a plan view,
the at least one cutting portion is not overlapped by the lead in a plan view, and
the cutting portion is filled with the molding material.

8. A high-frequency power amplifier, comprising the semiconductor device according to claim 2.

9. A high-frequency power amplifier, comprising the semiconductor device according to claim 3.

* * * * *